United States Patent
Sporer et al.

(10) Patent No.: US 10,217,660 B2
(45) Date of Patent: Feb. 26, 2019

(54) TECHNIQUE FOR PATTERNING ACTIVE REGIONS OF TRANSISTOR ELEMENTS IN A LATE MANUFACTURING STAGE

(71) Applicant: GLOBALFOUNDRIES Inc., Grand Cayman (KY)

(72) Inventors: Ryan Sporer, Mechanicville, NY (US); George Mulfinger, Wilton, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/652,585

(22) Filed: Jul. 18, 2017

(65) Prior Publication Data

US 2019/0027400 A1 Jan. 24, 2019

(51) Int. Cl.
| | |
|---|---|
| *H01L 21/762* | (2006.01) |
| *H01L 21/8234* | (2006.01) |
| *H01L 21/84* | (2006.01) |
| *H01L 21/308* | (2006.01) |
| *H01L 29/06* | (2006.01) |

(52) U.S. Cl.
CPC .... *H01L 21/76289* (2013.01); *H01L 21/3086* (2013.01); *H01L 21/823437* (2013.01); *H01L 21/84* (2013.01); *H01L 29/0649* (2013.01)

(58) Field of Classification Search
CPC ........... H01L 21/76289; H01L 21/3086; H01L 21/823437; H01L 21/84; H01L 29/0649
See application file for complete search history.

(56) References Cited

U.S. PATENT DOCUMENTS

| | | | |
|---|---|---|---|
| 9,064,932 B1* | 6/2015 | Pham | H01L 21/823437 |
| 2011/0147842 A1* | 6/2011 | Cappellani | H01L 21/26506 257/365 |
| 2012/0187501 A1* | 7/2012 | Zhu | H01L 21/76229 257/369 |
| 2013/0230965 A1* | 9/2013 | Sudo | H01L 21/0337 438/404 |
| 2014/0097465 A1* | 4/2014 | Shrivastava | H01L 27/0817 257/133 |
| 2016/0104678 A1* | 4/2016 | Jun | H01L 23/535 257/401 |
| 2016/0343861 A1* | 11/2016 | Doris | H01L 29/66795 |
| 2017/0148682 A1* | 5/2017 | Basker | H01L 21/823431 |
| 2017/0365680 A1* | 12/2017 | Smith | H01L 21/84 |

* cited by examiner

*Primary Examiner* — Sitaramarao S Yechuri
(74) *Attorney, Agent, or Firm* — Amerson Law Firm, PLLC

(57) ABSTRACT

When patterning active regions for sophisticated semiconductor devices, the cutting through active semiconductor regions previously patterned along a first lateral direction so as to obtain elongated semiconductor lines may be performed in a late manufacturing stage. That is, the cutting may be performed after patterning at least a portion of the gate electrode structures, thereby achieving a self-aligned patterning regime and also contributing to a reduction of strain loss.

20 Claims, 7 Drawing Sheets

TECHNIQUE FOR PATTERNING ACTIVE REGIONS OF TRANSISTOR ELEMENTS IN A LATE MANUFACTURING STAGE

BACKGROUND

1. Field of the Disclosure

Generally, the present disclosure relates to techniques and related semiconductor devices in which transistor elements may be formed in and on appropriately patterned active semiconductor regions requiring reduced lateral spacing.

2. Description of the Related Art

Significant progress has been made over the past decades in the field of semiconductor devices, wherein, in particular, sophisticated CMOS (complementary metal oxide semiconductor) techniques may be considered as a main contributor to this development. In the CMOS technique, a large number of P-type and N-type transistor elements may be integrated into a single semiconductor chip and may be functionally connected so as to form highly complex functional units, such as complex control circuitry, microcontrollers, CPUs (central processing units) and the like. The significant advances in terms of superior performance and increased integration density may be associated with the continuing reduction of critical dimensions of transistor elements, which may enable the integration of several hundred millions or more transistor elements in complex integrated circuits. The capability of reliably producing reduced critical dimensions in every new device generation has been mainly driven by significant improvements in lithography techniques and correlated patterning strategies, wherein even critical dimensions well beyond the optical resolution capabilities of modern lithography equipment may be obtained.

For example, defining active regions for transistor elements requires sophisticated lithography and patterning strategies, wherein, typically, two independent patterning sequences are involved, thereby contributing to overall cost and complexity of the manufacturing process.

In view of the situation described above, the present disclosure relates to techniques and semiconductor devices in which transistor elements may be formed on the basis of appropriately patterned active semiconductor regions, while avoiding, or at least reducing, the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative method disclosed herein includes bordering a semiconductor region of a semiconductor device along a length direction, forming at least a portion of each of a plurality of gate electrode structures above the semiconductor region, the at least a portion of each of the plurality of gate electrode structures having a length dimension extending along the length direction and a width dimension extending along a width direction, the width direction being transverse to the length direction, and after forming the plurality of gate electrode structures, bordering the semiconductor region along the width direction.

A further illustrative embodiment disclosed herein relates to a method of forming a semiconductor device. The method includes forming two adjacent electrode structures above a semiconductor layer, wherein the two adjacent electrode structures form a space therebetween. The method further includes removing the semiconductor layer in the space by using the two adjacent electrode structures as an etch mask.

A still further illustrative embodiment disclosed herein relates to a semiconductor device. The semiconductor device includes a semiconductor region having a first bounding surface extending along a first lateral direction and a second bounding surface extending along a second lateral direction. The semiconductor device further includes an electrode structure formed at least partially above the semiconductor region and has a distal sidewall face and a proximal sidewall face with respect to the second bounding surface, wherein the distal and proximal sidewall faces are formed by respective sidewall spacers and extend along the second lateral direction. Moreover, the proximal sidewall face and the second bounding surface are substantially aligned with each other along a depth direction that is perpendicular to the first and second lateral directions, wherein a maximum deviation of the alignment corresponds to a width of the sidewall spacers.

BRIEF DESCRIPTION OF THE DRAWINGS

The disclosure may be understood by reference to the following description taken in conjunction with the accompanying drawings, in which like reference numerals identify like elements, and in which.

Figure 1:
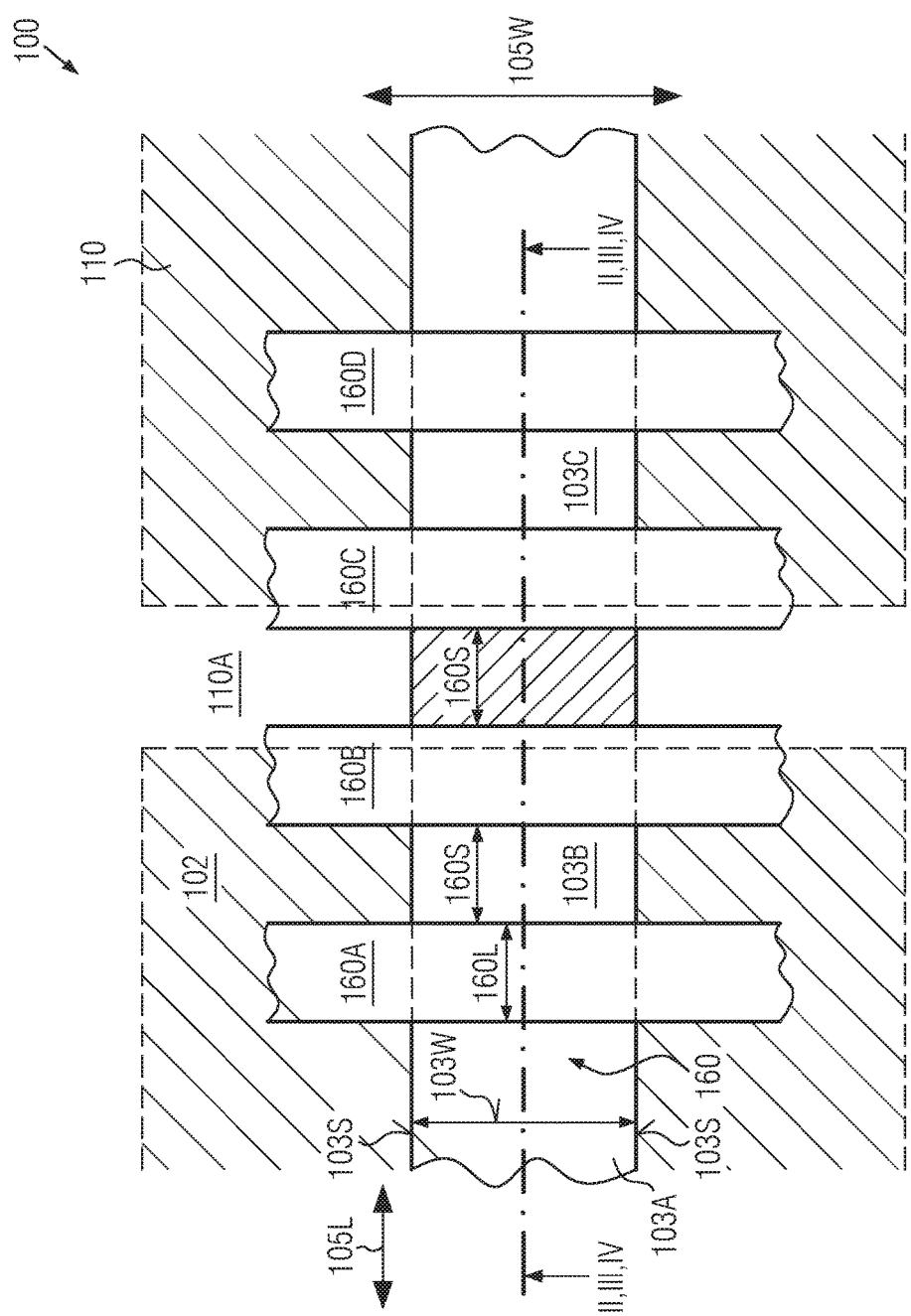
FIG. 1 schematically illustrates a top view of a semiconductor device in a manufacturing stage in which a longitudinal active semiconductor region comprises a plurality of gate electrode structures, wherein the longitudinal semiconductor region is to be separated into two adjacent active semiconductor regions, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As briefly discussed above, although the reduction of critical dimensions, in particular, the gate length of field effect transistors, may not only contribute to reduced size of the circuit elements and, thus, promote integration density, basically a reduced length of a conductive channel of a field effect transistor may also result in increased switching speed, thereby allowing the operation of complex integrated circuits at increased clock frequencies. On the other hand, the continuous reduction of critical features sizes, such as the gate length of field effect transistors, or the dimensions of active regions of transistors, is also accompanied by certain side effects that may have to be addressed in order to not unduly offset many of the advantages gained by the reduced transistor dimensions. For example, upon further reducing the length of a channel of a field effect transistor, the capability of controlling the channel from a high ohmic state into a low ohmic state may decrease due to a plurality of respective effects, also referred to as "short channel" effects, wherein the proportion of edge effects may represent an ever-increasing contribution to the transistor behavior, thereby negatively affecting overall controllability of the channel region. Consequently, great efforts have been made to provide improved mechanisms that may allow superior control of semiconductor channels, even when provided with reduced length, which, in currently available advanced device generations, may be 30 nm and significantly less for well-established planar transistor architectures. In other developments, three-dimensional transistor architectures, such as FinFETs, may be used so as to obtain superior channel controllability, wherein respective semiconductor fins may have a width of 20 nm and less.

For example, the capacitive coupling between the gate electrode and the channel region may be increased by reducing the thickness of a corresponding gate dielectric material, wherein, in recent developments, typical gate dielectric materials, such as silicon dioxide, may be provided with a physical thickness of 2 nm and even less. Since a corresponding reduction of the physical thickness of such well-established dielectric materials may be associated with reduced robustness of respective transistor elements with respect to electrical breakdown and may also contribute to increased leakage currents, complex material systems have been developed in which a material with significantly increased dielectric constant may be incorporated so as to obtain an increased physical thickness, while maintaining the corresponding oxide equivalent thickness at a desired level, for instance, of 1.5 nm and even less, in sophisticated transistor elements.

The continuous reduction of critical feature sizes, although representing a promising approach for increasing performance of transistor elements due to achieving reduced switching times, as discussed above, may, thus, be accompanied by a plurality of technological challenges, which may have to be addressed in an appropriate manner. Therefore, the continuous reduction of the transistor dimensions is typically not a straightforward development. Consequently, other approaches have been taken in order to further increase overall transistor performance, even for otherwise given architectural and dimensional constraints. For example, a plurality of strain engineering techniques have been developed and introduced into the manufacturing techniques based on the fact that many of the semiconductor materials may exhibit varying charge carrier mobility that may depend on strain induced in the lattice structure of these materials. For example, biaxial strain in crystalline silicon material may contribute to an increase of electron mobility, while uniaxial strain may provide increased hole mobility. For these reasons, strain-inducing mechanisms may be implemented in modern sophisticated circuits, thereby obtaining performance improvements of several percent compared to non-strain engineered devices of the same basic device configuration.

Moreover, other concepts have been developed to further improve overall transistor performance, for instance, by increasingly applying an SOI (silicon- or semiconductor-on-insulator) architecture in which a buried insulating layer may provide complete electrical isolation of respective active semiconductor regions, i.e., semiconductor regions in which drain and source regions and channel regions for transistor elements are to be formed. Among others, the SOI architecture may offer significant advantages with respect to parasitic capacitances of transistor elements, thereby also contributing to increased switching speed and, thus, superior performance. Furthermore, in further developments, fully depleted transistor configurations have been implemented in sophisticated semiconductor devices, which may also contribute to superior channel controllability and, thus, transistor performance. To this end, a very thin crystalline semiconductor material may be typically provided as the active semiconductor region, wherein a moderately low dopant concentration or a substantially non-doped state of the semiconductor material may also avoid or at least significantly reduce the effects of dopant fluctuations in channel regions of significantly reduced length. For example, an initial layer thickness of a silicon-based semiconductor device may be 15 nm and significantly less.

As discussed above, in many technological approaches, one or more of the concepts for improving transistor performance may have to be combined in order to meet economic and technological requirements for a given technology node. For example, SOI substrates may be provided so as to have a moderately thin semiconductor layer formed thereon, wherein the semiconductor layer may per se have a desired strain, while, in other concepts, respective areas of biaxial or uniaxial strain may be formed on the basis of respective process techniques, such as epitaxial growth of specific semiconductor materials, in order to obtain a desired mismatch of lattice constants and the like. In this manner, the basic charge carrier mobility in any such strained semiconductor materials may be increased, thereby achieving, for otherwise identical device parameters, a significant improvement of switching speed, current carrying capacity and the like.

As previously discussed, forming transistor elements or other circuit elements may require a lateral bordering of respective active semiconductor regions, which may be frequently accomplished on the basis of appropriate isolation structures, such as shallow trench isolations and the like. That is, in an early manufacturing stage, respective isolation structures may be formed in order to appropriately divide the substrate under consideration into appropriately dimensioned active semiconductor regions, in and on which respective circuit elements, such as transistors, capacitors, resistors and the like, may be formed. As discussed above, in view of overall device performance, the lateral dimensions of the transistor elements, in particular, have to be adapted to the circuit requirements, wherein, in densely packed device regions, such as static RAM areas, high integration density may be required so that a lateral spacing of respective active semiconductor regions may also have to be reduced as much as possible. That is, the dimensions of at least some of the isolation structures, or generally the lateral spacing between some of the active semiconductor regions, may be comparable to the minimum critical dimensions of transistor elements and may, therefore, require sophisticated lithography and patterning strategies, as will be discussed in the following.

Basically, a typical process sequence for forming transistor elements of a sophisticated semiconductor device may comprise the provision of an appropriate basic semiconductor material, such as a crystalline silicon material and the like, which, in some applications, as discussed above, may be provided in the form of a semiconductor layer formed on a buried insulating layer in order to form at least a portion of the transistor elements on the basis of an SOI configuration. Thereafter, if required, respective processes may be applied, such as epitaxial growth of certain material compositions at specific areas in and on the basic semiconductor material, for instance, providing germanium/silicon semiconductor regions, which may be advantageous in view of P-type transistors due to threshold voltage adjustment, enhanced carrier mobility and the like. In a further process sequence, the active semiconductor regions may be laterally defined by sophisticated lithography and etch techniques.

Generally, for sophisticated semiconductor devices, at least one lateral dimension of respective active semiconductor regions, at least in critical device areas with high integration density, may require the application of a split patterning sequence, for instance, by applying two separate lithography processes and associated patterning techniques, for instance, by first forming isolation trenches along one lateral direction, thereby separating the active semiconductor regions from each other along a second orthogonal lateral direction, followed by a further lithography sequence and patterning process applied so as to separate or "cut" the previously patterned active semiconductor region leading to respective adjacent, now fully delineated active regions.

Thereafter, the gate electrode structures may be formed on the basis of any appropriate process strategy, wherein, as discussed above, more or less complex material systems may have to be deposited and subsequently patterned, which may also require highly sophisticated lithography and patterning strategies. Thereafter, respective drain and source regions may be formed, for instance, by ion implantation, selective epitaxial growth techniques and the like. Thereafter, contact elements may be formed and a complex metallization system is typically required for providing the complex system of interconnecting the various individual semiconductor devices and circuit portions.

As indicated above, in many sophisticated applications, respective strain engineering techniques may be applied in an early manufacturing stage, for instance, by providing an appropriately strained basic semiconductor material and/or by forming respective strained semiconductor regions locally in the substrate, wherein these techniques are typically applied prior to actual patterning the active semiconductor regions. By forming respective isolation trenches, which may include at least the removal of the material of the basic semiconductor layer along two different lateral directions, the strain characteristics of the basic semiconductor material may be significantly changed, thereby possibly contributing to a less pronounced gain in performance than expected. For example, in particular, when "cutting" the longitudinal active semiconductor regions previously bordered along the first lateral direction, the corresponding uniaxial strain component may be adversely affected upon cutting these active regions into two or more neighboring active regions, thereby also restricting the performance gain in these active regions. The corresponding loss in performance may even become more pronounced upon the further scaling of device dimensions, since, as already discussed above, in this case, the corresponding dimensions of the active semiconductor regions and, in particular, the spacing between two adjacent semiconductor regions, must also be accordingly reduced. Moreover, as discussed above, due to the high complexity and the different lithography sequences required for bordering or patterning the active semiconductor regions in two orthogonal lateral directions, respective substantially unavoidable overlay errors may result in a certain degree of variability, which may have to be taken into consideration upon establishing appropriate design rules for a respective sophisticated semiconductor device.

The present disclosure is therefore based on the concept that superior process conditions for finally patterning an active semiconductor region may be provided by "postponing" the final patterning or cutting of longitudinal active semiconductor regions previously bordered on the basis of well-established trench isolation techniques. This approach may result in reduced overlay errors and reduced overall complexity of a respective patterning sequence in terms of reduced complexity of the lithography process and/or the etch process. That is, by applying a basically "self-aligned" patterning regime, wherein respective gate electrode structures may be formed, at least to a specific degree of completion, and respective gate electrode structures positioned at intended end portions of the active semiconductor regions may then be used as efficient etch masks in order to remove the semiconductor material formed between the corresponding adjacent gate electrode structures. Consequently, the positioning accuracy of the corresponding end portion of adjacent active semiconductor regions in one lateral direction may be substantially determined by the precision and accuracy of patterning the respective gate electrode structures, and may, therefore, be substantially independent of the overlay accuracy and specifics of the corresponding lithography process. Moreover, the lateral offset between respective two adjacent active semiconductor regions may, therefore, be determined on the basis of critical dimensions, such as spaces of neighboring gate electrode structures, thereby automatically scaling the spacing between two adjacent active semiconductor regions in the corresponding lateral direction. In this manner, high integration density may be achieved, particularly in critical device areas, such as static RAM regions, without requiring additional complexity of a corresponding patterning sequence. Moreover, as will be discussed later on in more detail, the self-aligned patterning regime may be applied on the basis of additional deposition techniques, thereby providing the potential of even further reducing a lateral offset between adjacent active semiconductor regions without adding to the complexity of a corresponding lithography process.

The corresponding adjacent gate electrode structures, which may define the space therebetween for separating the underlying active semiconductor regions, may be provided as fully functional electrode structures, such as gate electrode structures for field effect transistors, gate lines for providing a connection between neighboring semiconductor regions and the like, while, in other cases, the corresponding gate electrode structures may be provided as dummy structures, which may provide more uniform process conditions during the patterning of functional gate electrode structures and which may, therefore, also provide superior process conditions upon cutting the longitudinal semiconductor regions. Moreover, providing and using the gate electrode structures prior to actually cutting through the semiconductor regions along one lateral direction results in superior mechanical robustness of the active semiconductor regions after their patterning, which may be advantageous in process techniques in which the semiconductor material may be basically provided in the form of a strained semiconductor material. That is, by providing at least a significant portion of the gate electrode structures prior to actually cutting the active semiconductor regions, even end portions of the patterned semiconductor regions may be reliably "tacked" to the underlying and neighboring materials, thereby imparting superior stability with respect to strain relaxation in the longitudinal direction of the active semiconductor regions. Since uniaxial strain loss may particularly contribute to performance loss, for instance, of sophisticated P-type transistors, a reduction or avoidance of a corresponding strain loss may significantly contribute to a gain in performance of such sophisticated transistor elements.

Consequently, patterning the longitudinal semiconductor regions after having formed thereon a respective material system for gate electrode structures may contribute to superior process conditions irrespective of when the corresponding patterning sequence may be performed after having provided the respective stack of gate layer materials.

With reference to FIGS. 1, 2A-2D, 3A-3E and 4A-4C, further illustrative embodiments will now be described in more detail.

FIG. 1 schematically illustrates a top view of a semiconductor device 100, which may represent any semiconductor device that includes one or more device regions in which field effect transistors are to be formed on the basis of an appropriate active semiconductor region and a gate electrode structure. The semiconductor device 100 as shown in FIG. 1 may represent a moderately advanced manufacturing stage in which a longitudinal active semiconductor region 103A may be formed from any appropriate initial semiconductor layer (not shown) and which may, therefore, be bordered or delineated along a first lateral direction, indicated as 105L. It should be appreciated that bordered or delineated along the lateral direction 105L is to be understood so that the elongated active semiconductor region 103A may have a bounding surface 103S extending along the first lateral direction 105L, and which may also extend along a depth direction, i.e., a direction perpendicular to the drawing plane of FIG. 1, thereby representing an interface formed with another material, such as a dielectric material of an isolation structure 102, or representing a sidewall surface of an isolation trench, if a corresponding isolation trench may not be filled with a dielectric material in this manufacturing stage. Consequently, the longitudinal active semiconductor region 103A may also comprise a bounding surface 103S at an opposite side, i.e., two oppositely positioned bounding surfaces 103S may define a lateral extension of the longitudinal active region 103A along a second lateral direction 105W, which may also be referred to as a width direction. Consequently, the longitudinal semiconductor region 103A may have a width 103W defined by the two opposing bounding surfaces 103S. It should be appreciated that the width 103W of the semiconductor region 103A may correspond to the respective transistor width dimensions required for respective transistor elements to be formed at least in certain device areas of the semiconductor device 100. For instance, in densely packed device areas, such as static RAM areas, the width 105W for at least one type of transistor may be comparable to critical dimensions of respective transistor elements, such as gate length and the like.

Furthermore, in this manufacturing stage, a plurality of gate electrode structures, collectively referred to as 160, such as gate electrode structures 160A, 160B, 160C, 160D, may be provided and may extend across at least the width 103W of the longitudinal active region 103A. It should be appreciated that the gate electrode structures 160 may be in any appropriate stage of the overall patterning process, wherein a corresponding length of the gate electrode structures 160, indicated by 160L, may be substantially determined by a corresponding extension of a gate electrode material (not shown) formed in the vicinity of a corresponding gate dielectric material (not shown). Consequently, the actual length of the gate electrode structure 160 may depend on the corresponding state of completion, wherein, for instance, in an early phase of the gate patterning process, a corresponding mask or cap material may be provided so as to have a specific length dimension, which may then be used for the further patterning of any underlying material layers, such as electrode materials, gate dielectric materials and the like. In other stages of the manufacturing process, the gate electrode structures 160 may comprise a sidewall spacer structure of appropriate width or thickness which may also contribute to the actual length of the gate electrode structures 160.

As previously discussed, in densely packed device regions, a plurality of adjacent transistor elements may have to be provided within a single active semiconductor region, thereby requiring the positioning of respective adjacent gate electrode structures 160 with a spacing that is comparable to or even less than the gate length 160L. For instance, the spacing of adjacent gate electrode structures may be indicated as 160S and may, in sophisticated applications, respond to a value of 30 nm and significantly less. It should be appreciated, however, that the principles disclosed herein, also highly advantageous for extremely scaled semiconductor devices, may also be applied to any semiconductor device, irrespective of the minimum critical dimension defined therein.

As previously discussed, the longitudinal active semiconductor region 103A may be bordered or delineated along the lateral direction 105L and may need a further bordering along the second lateral direction 105W, which may be accomplished in the presence of the gate electrode structures 160, irrespective of the degree of completeness of the gate electrode structures 160. For example, the gate electrode structures 160B, 160C may define a space therebetween, also indicated as 160S, in which the material of the semiconductor region 103A may have to be removed in order to obtain electrically isolated active semiconductor regions on the basis of the initial longitudinal region 103A. In some illustrative embodiments, the gate electrode structures 160B, 160C may represent functional electrode structures, which may be used as actual gate electrode structures and/or as conductive lines for connecting other device areas with each other by "bridging" the semiconductor region 103A along the second lateral direction 105W. In other cases, the gate electrode structures 160B, 160C may be considered as structures that have no electronic function and may, therefore, be considered as dummy structures. Nevertheless, the gate electrode structures 160B, 160C, even when provided as dummy structures, may play an important role in patterning the gate electrode structures 160 in order to provide very similar local process conditions during respective patterning sequences, such as plasma-assisted etch processes and the like, so as to increase overall process uniformity and the like.

Moreover, during the further patterning of the active region 103A, the gate electrode structures 160B, 160C may also act as patterning masks for removing the semiconductor material of the region 103A within the space 160S on the basis of any appropriate etch regime, thereby providing a substantially self-aligned patterning regime. To this end, a mask 110 in the form of one or more polymer materials, such as a resist material and the like, may be formed so as to cover the spaces 106S of any adjacent gate electrode structures, except for the space 106S between the gate electrode structures 160B, 160C. To this end, lithography techniques may be applied, wherein, for instance, overlay accuracy is of less concern, since a corresponding deviation in the order of magnitude of the gate length 160L may be tolerable with respect to appropriately positioning a corresponding opening 110A of the mask 110.

Similarly, a width of the opening 110A along the first lateral direction 105L may have to be defined with a position corresponding to a tolerance in the range of the gate length 160L. Consequently, in total, a corresponding lithography patterning sequence may have to provide for a combination of overlay accuracy and dimension fidelity with a tolerance in the range of the gate length 160L, while the exact position of space 160S and, thus, of the boundary between respective parts of the semiconductor region 103A, are still defined by the position of the gate electrode structures 160B, 160C. Consequently, on the basis of the mask 110, any appropriate etch strategy may be applied in order to remove unwanted material of the semiconductor region 103A, thereby obtaining two separate active regions 103B, 103C having a lateral offset along the lateral direction 105L that may be obtained in a self-aligned manner on the basis of the initial spacing 160S.

Respective processes for forming the semiconductor device 100 may be described in the context of FIGS. 2A-2D, 3A-3E and 4A-4C, wherein further illustrative embodiments will also be described.

Figure 2A:
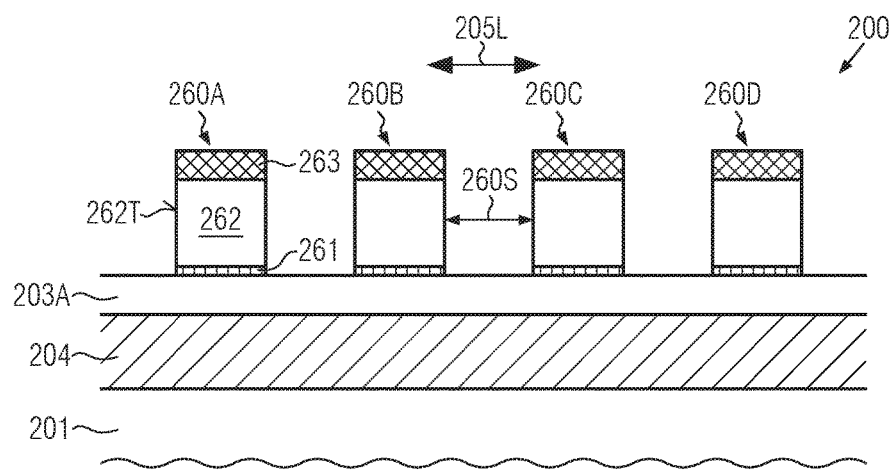
FIGS. 2A-2D schematically illustrate cross-sectional views of a semiconductor device, such as the semiconductor device of FIG. 1, during various manufacturing stages in "cutting" a longitudinal semiconductor region in a moderately late manufacturing stage, according to illustrative embodiments.

FIG. 2A schematically illustrates a cross-sectional view of a semiconductor device 200 in a specific manufacturing stage in which gate electrode structures 260A-260D may be formed on an active semiconductor region 203A that is patterned along a first lateral direction. For instance, the semiconductor device 200 may correspond to the semiconductor device 100 as previously explained in the context of FIG. 1. Furthermore, the cross-section may be taken along a line indicated as II, III, IV in FIG. 1. Moreover, the semiconductor device 200 may comprise a substrate 201, which may be provided in the form of any appropriate carrier material for forming thereabove or providing thereabove an appropriate crystalline semiconductor material, such as a silicon material, silicon/germanium material, germanium material and the like, depending on overall device requirements. Moreover, in some illustrative embodiments, and as already discussed above, the semiconductor device 200 may be formed on the basis of an SOI configuration, at least in certain device regions, so that a buried insulating layer 204 may comprise standard dielectric materials, such as silicon dioxide, silicon nitride and the like, or high-k dielectric materials, or any combination thereof. It should be appreciated that, in some illustrative embodiments, the semiconductor device 200 may include transistor elements still to be completed on the basis of at least some of the gate electrode structures 260A-260D, which may be implemented in the form of a fully depleted transistor configuration, such that, in particular, the active regions 203A may have a thickness and material composition so as to comply with the corresponding requirements. For instance, in some illustrative embodiments, a thickness of the semiconductor region 203A may be 15 nm and significantly less. Furthermore, the thickness of the buried insulating layer 204 may also be appropriately adapted to the overall device requirements, for instance, in view of providing additional control mechanisms for enhancing transistor performance, such as providing a back bias mechanism and the like. Furthermore, as also discussed, in some illustrative embodiments, the semiconductor region 203A may be formed on the basis of internal strain in order to obtain superior charge carrier mobility, as discussed above.

In the manufacturing stage shown, the gate electrode structures 260A-260D may comprise one or more gate dielectric materials 261 and one or more electrode materials 262 and may also comprise a cap or mask material 263, which may, however, in some illustrative embodiments, be removed in a later manufacturing stage, while, in other cases, the cap material 263 or at least a portion thereof, may be preserved. As already discussed in the context of the semiconductor device 100, the gate electrode structures 260A-260D may be formed on the basis of a required gate length and a respective spacing 260S between two adjacent gate electrode structures in accordance with design criteria.

The semiconductor device 200 as shown in FIG. 2A may be formed on the basis of the following processes. After providing a semiconductor layer, for instance, in the form of an SOI substrate and the like, the semiconductor material may be processed in order to obtain a desired material composition, dopant concentration and the like. Prior to or after respective processes, a patterning sequence may be applied in which respective isolation trenches may be formed so as to form the longitudinal active region 203A by bordering it along a first lateral direction 205L, thereby forming respective bounding surfaces, such as the bounding surfaces 103S as shown in FIG. 1 in the context of the active region 103A. To this end, well-established, yet complex, lithography techniques and patterning sequences may be applied and, if required, the resulting isolation trenches may be filled with an appropriate dielectric material, thereby forming isolation structures, such as the isolation structure 102 of the semiconductor device 100 of FIG. 1. Consequently, after completing the respective process sequence, the semiconductor region 203A may be provided as an elongated semiconductor region extending along the first lateral direction 205L.

After performing respective implantation processes, if required, for instance, for introducing dopant species into deeper lying device areas, such as the substrate material 201, a patterning sequence may be applied for forming the gate electrode structures 260A-260D. To this end, one or more materials for the gate dielectric material may be formed, for instance, by deposition and/or oxidation, depending on the complexity of the respective gate dielectric material. Moreover, additional material systems, such as doped semiconductor material, metal-containing species, and the like, may be provided so as to comply with the requirements for obtaining high capacitive coupling, adjusting a desired threshold voltage and the like. Thereafter, one or more electrode materials 262 may be formed by appropriate deposition techniques, possibly in combination with further processes for adjusting the desired material characteristics, such as implanting dopants, performing one or more anneal processes and the like. Thereafter, the cap material 263 may be deposited, for instance, in the form of silicon nitride, silicon dioxide and the like. It should be appreciated that, upon depositing at least some of these materials, the corresponding mechanical characteristics of the semiconductor region 203A may still be preserved, for instance, any strain component prevailing therein. Thereafter, conventional patterning regimes may be applied, for instance, by sophisticated lithography techniques in order to pattern the cap material 263, which may then be used as mask material for the patterning of the further materials. After completing the patterning sequence, the gate electrode structures 260A-260D may be formed so as to expose sidewall surface areas 262T, in particular, of the electrode material 262 in addition to one or more dielectric materials of the gate dielectric layer 261.

In some illustrative embodiments, the sidewall surface areas 262T may be passivated by forming a thin liner material, such as a silicon nitride material (not shown), prior to continuing the further processing. In other illustrative embodiments, the processing may be continued on the basis of the manufacturing stage shown in FIG. 2A by preparing the semiconductor device 200 for a further patterning process for cutting through the semiconductor region 203A, for instance, in the space 260S defined by the neighboring gate electrode structures 260B, 260C.

Figure 2B:
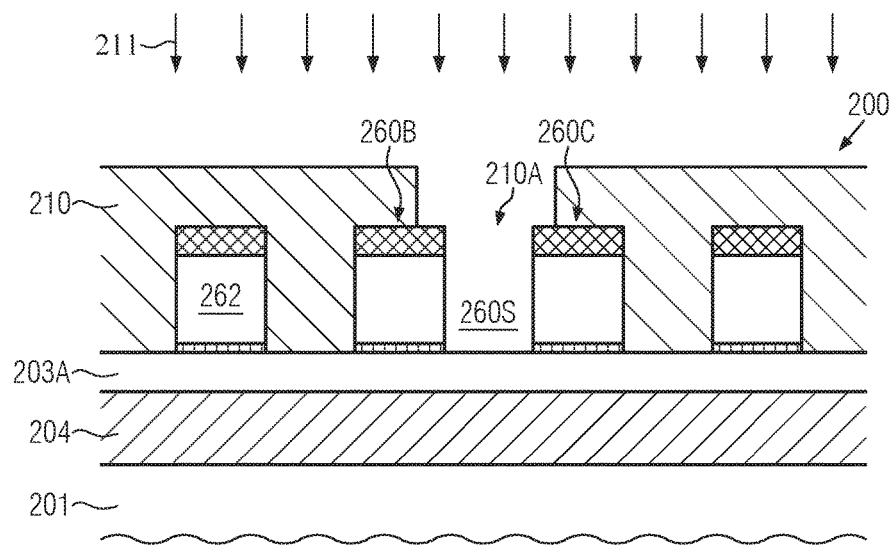

FIG. 2B schematically illustrates the semiconductor device 200 after having formed thereon an etch mask 210, including an opening 210A that is positioned to expose the space 260S between the gate electrodes 260B, 260C. In some illustrative embodiments, the mask 210 may be formed on the basis of polymer materials, such as resist material, possibly in combination with an anti-reflective coating and the like, without requiring the deposition of any hard mask materials. The mask 210 may be patterned on the basis of lithography techniques, wherein, as discussed above in the context of the semiconductor device 100, overlay aspects may be of less relevance, since the separating region and the lateral distance thereof are precisely defined by the gate electrode structures 260B, 260C, i.e., by the space or spacing 260S. That is, variations with respect to the size and position of the opening 210A in the order of magnitude of the gate length of the gate electrode structures 260B, 260C may have substantially no effect on size and distance of a separating region or isolation trench to be formed in the semiconductor region 203A.

Figure 2C:
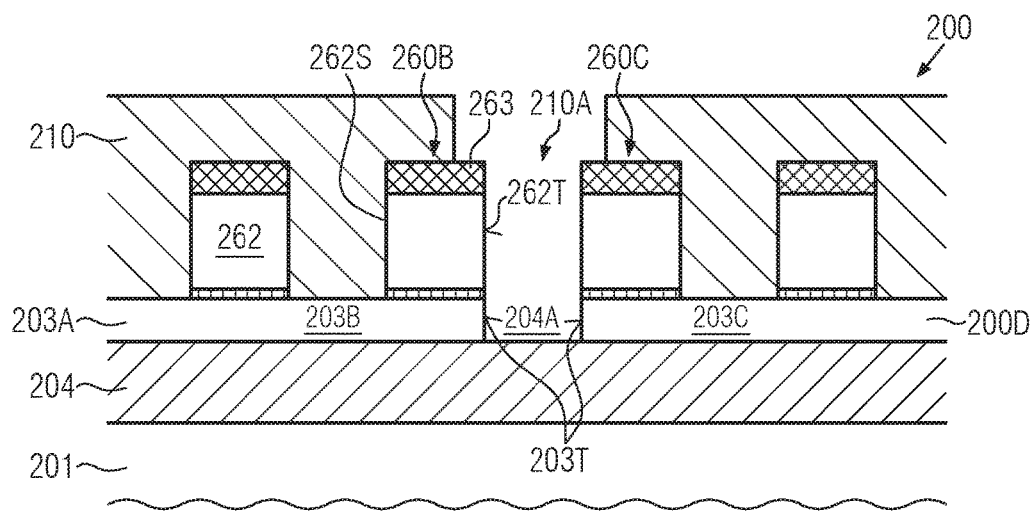

FIG. 2C schematically illustrates a cross-sectional view of the semiconductor device 200 in a further advanced manufacturing stage. As illustrated, an etch sequence 211 may be applied in order to remove material of the semiconductor region 203A in order to form an isolation trench 204A, thereby obtaining separated active semiconductor regions 203B, 203C.

It should be appreciated that well-established anisotropic etch recipes for a large number of semiconductor materials, such as silicon, silicon/germanium and the like, are available and may be used, wherein, in particular, the cap material 263 of the gate electrode structures 260B, 260C may act as an etch mask, thereby providing a self-aligned etch regime for forming the isolation trench 204A. On the other hand, undue material removal in any other spaces between adjacent gate electrode structures may be avoided by the mask 210. Consequently, upon forming the isolation trench 204A, respective bounding surfaces 203T extending along a second lateral direction, i.e., a lateral direction corresponding to a direction perpendicular to the drawing plane of FIG. 2C, for instance, indicated as 105W in FIG. 1, may border the respective active semiconductor regions 203B, 203C along the first lateral direction 205L (see FIG. 2A). Consequently, the bounding surfaces 203T may be aligned with respect to a depth direction, i.e., in FIG. 2C, the vertical direction, to the sidewall surface 262T of the gate electrode structures 260B when referring to the semiconductor region 203B, while the corresponding bounding surface 203T may be aligned with respect to a respective sidewall surface area of the gate electrode structure 260C when referring to the active region 203C.

It should be appreciated that the sidewall surface area 262S may be referred to as a proximal sidewall face with respect to the bounding surface 203T that is substantially aligned with the proximal sidewall face 262T. Similarly, a sidewall surface 262S of the gate electrode structure 260B opposite the sidewall surface area 262T may be referred to as a distal sidewall face with respect to the bounding surface 203T, so that, in this manufacturing stage, the sidewall faces 262T, 262S may substantially define the length of the gate electrode structure 260B.

In other cases, as previously discussed, a sidewall liner (not shown) may be provided in this manufacturing stage and may then define the corresponding sidewall faces 262T, 262S, thereby also resulting in respective bounding surfaces 203T, which, however, may have a slightly reduced lateral offset due to the corresponding thickness of the liner material (not shown). Consequently, the respective bounding surfaces 203T may be substantially aligned with respect to the corresponding sidewall faces 262T, wherein a certain deviation of the alignment may depend on process-specific fluctuations, the thickness of the material of the semiconductor regions 203B, 203C, and the like.

Although the etch process 211 has previously been described as an etch sequence primarily including an anisotropic etch component, in other embodiments, a wet chemical etch recipe may be applied which may result in a certain degree of underetching of the gate electrode structures 260B, 260C, wherein such underetching may be acceptable in many applications due to providing material of the semiconductor regions 203B, 203C as a very thin semiconductor material. Furthermore, in some illustrative embodiments, the etch process 211, or at least a final phase thereof, may be controlled on the basis of the buried insulating layer 204, which may, thus, act as an etch stop material.

After having formed the isolation trench 204A, further processing may be continued by removing the mask 210, which, in some illustrative embodiments, may be accomplished on the basis of well-established wet chemical removal processes, if interaction of the corresponding wet chemical component with the sidewall faces 262T may substantially not result in any adverse effects on the further processing and/or for the functional behavior of the gate electrode structures 260B, 260C when provided as functional components. In other illustrative embodiments, the process for removing the mask 210 may be performed on the basis of substantially plasma-assisted recipes, such as supplying an oxygen plasma and the like, wherein a highly directional removal behavior may result in a reduced amount of damage at the sidewall faces 262T. In other cases, as discussed above, as respective liner (not shown) may provide superior integrity of the sidewall faces 262T, 262S during the removal of the mask 210.

Figure 2D:
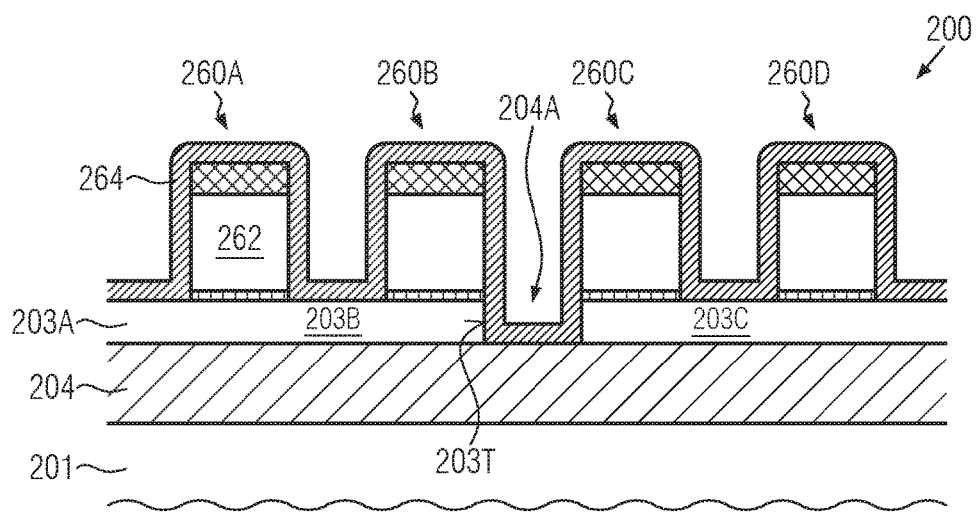

FIG. 2D schematically illustrates the semiconductor device 200 in a further advanced manufacturing stage after removing the mask 210 (FIG. 2C). As illustrated, a material layer 264 may be provided on exposed surface areas of the semiconductor device 200 and may, therefore, also be formed within the isolation trench 204A and, in particular, on the previously formed bounding surfaces 203T. The material layer 264 may be provided in the form of any appropriate dielectric material, such as silicon dioxide, silicon nitride and the like, and may be subsequently patterned so as to form sidewall spacers for the gate electrode structures 260A-260D, which may be accomplished by applying well-established anisotropic etch techniques. Consequently, during the respective patterning process, respective sidewall spacers at the side of the gate electrode structures 260B, 260C facing the isolation trench 204A may extend down to the buried insulating layer 204, thereby covering the previously formed bounding surfaces 203T.

With reference to FIGS. 3A-3E, further illustrative embodiments will now be described in more detail.

Figure 3A:
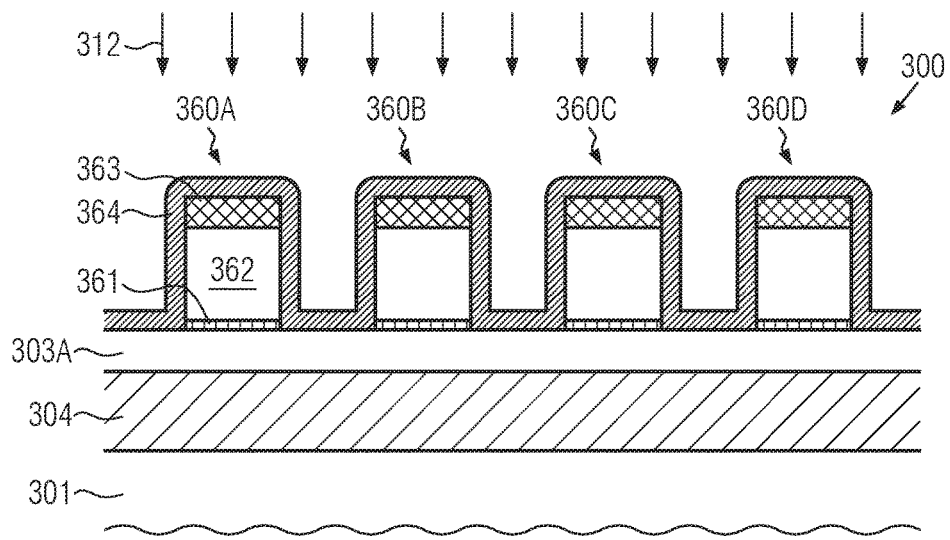
FIGS. 3A-3C schematically illustrate cross-sectional views of a semiconductor device, such as the semiconductor device of FIG. 1, during various manufacturing stages in which a longitudinal semiconductor region is patterned in the presence of gate electrode structures having formed thereon a sidewall spacer, according to illustrative embodiments.

FIG. 3A schematically illustrates a cross-sectional view of a semiconductor device 300, which may have basically the same configuration as the semiconductor devices 100, 200 previously described with reference to FIGS. 1 and 2A-2D. That is, the semiconductor device 300 may comprise a substrate 301 and a semiconductor region 303A, which may be bordered along a first lateral direction, as also previously discussed. Furthermore, in some illustrative embodiments, the semiconductor region 303A may be formed on a buried insulating layer 304. Moreover, gate electrode structures 360A-306D may be formed so as to extend across the semiconductor region 303A in a second lateral direction, i.e., in a direction perpendicular to the drawing plane of FIG. 3A.

It should be appreciated that the cross-sectional view of FIG. 3A may basically correspond to the section III indicated in FIG. 1. In this manufacturing stage, the gate electrode structures 360A-360D may have a configuration as also previously described with reference to the semiconductor device 200 and may, thus, comprise a gate dielectric material 361, one or more electrode materials 362, a cap material 363, wherein any of these components may be configured as is already previously described. Moreover, a spacer layer 364 may be formed on exposed surface portions of the semiconductor device 300. The spacer layer 364 may comprise any appropriate material, such as silicon dioxide, silicon nitride and the like, and may have a thickness as required for the further processing of the gate electrode structures 360A-360D.

The semiconductor device 300 may be formed in accordance with process strategies and techniques as are already previously discussed in the context of the semiconductor devices 100 and 200. After forming the spacer layer 364, an anisotropic etch process 312 may be applied, thereby substantially removing the spacer material from horizontal device portions, while preserving a significant amount thereof on sidewalls of the gate electrode structures 360A-360D so as to form respective sidewall spacers.

Figure 3B:
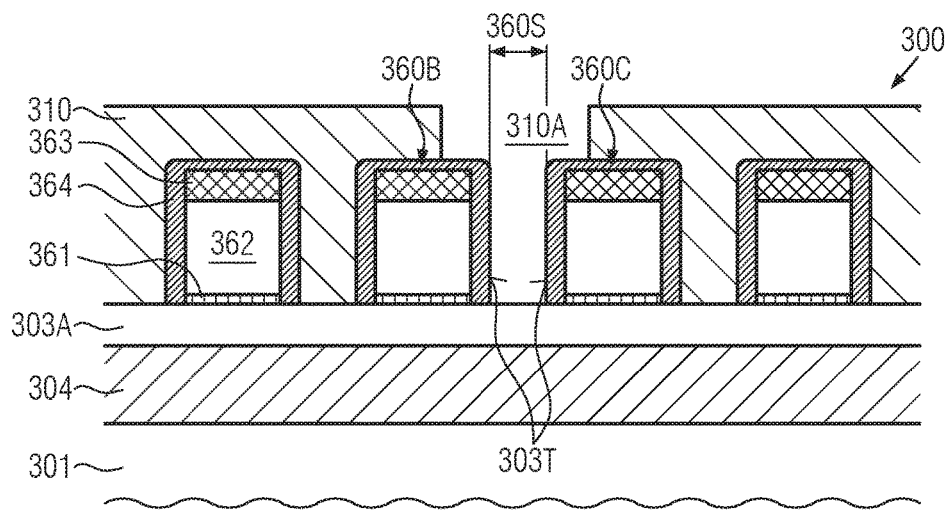

FIG. 3B schematically illustrates the semiconductor device 300 having formed thereon an etch mask 310 having an opening 310A so as to expose a spacing or a space 360S between the gate electrode structures 360B, 360C. Regarding any process strategies for forming the mask 310 and aligning the mask 310 with respect to the gate electrode structures 360B, 360C, the same criteria may apply as also previously discussed. Consequently, since the gate electrode structures 360A-360D comprise sidewall spacers, which may also be referred to by the reference numeral 364, the spacing 360S is substantially determined by the proximal sidewall faces 303T formed by the spacers 364. Consequently, compared to the situation described with reference to the semiconductor 200 for otherwise the same device architecture, the spacing 360S may be less compared to the spacing 260S.

Figure 3C:
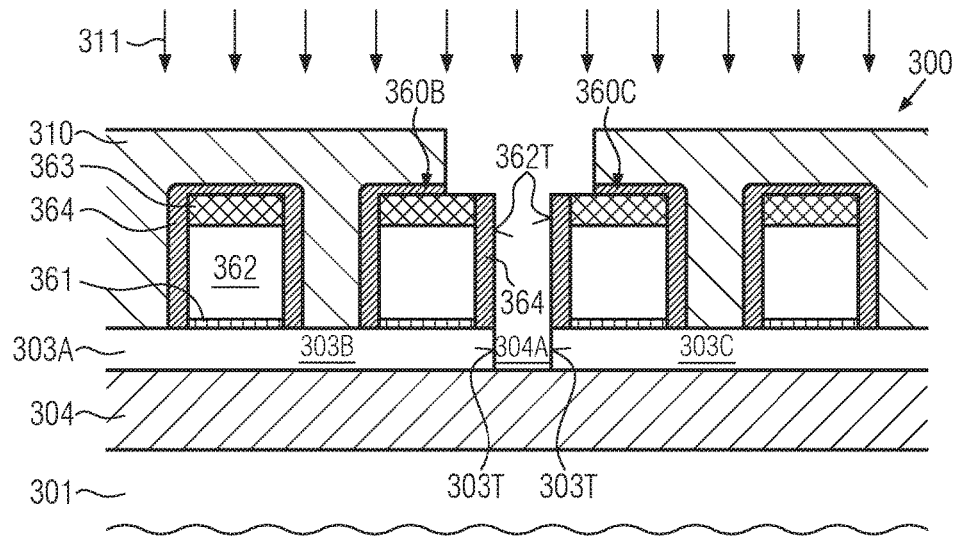

FIG. 3C schematically illustrates the semiconductor device 300 during an etch process 311 for etching through the semiconductor material so as to form an isolation trench 304A in order to provide separate active regions 303B, 303C. With respect to the etch sequence 311, the same criteria may apply as previously discussed in the context of the etch sequence 211. Consequently, respective bounding surfaces 303T may be formed as end portions of the respective active regions 303B, 303C, which may, therefore, be aligned to the sidewall faces 362T and may represent the respective proximal sidewall surface areas with respect to the bounding surfaces 303T, as is also discussed above. It should be appreciated that, generally, superior process robustness may be achieved, since any sensitive surface areas of materials of the gate electrode structure may be covered by the sidewall spacers 364, thereby even enabling the application of isotropic etch recipes, since, as previously discussed, a certain degree of underetching of the active semiconductor regions 303B, 303C may be acceptable, depending on the overall device requirements. Furthermore, the further processing, i.e., the removal of the mask 310, may be accomplished by any well-established recipes, such as plasma-assisted etch chemistries, wet chemical etch chemistries and the like, since any sensitive device areas may be reliably encapsulated by the sidewall spacers 364.

After the removal of the mask 310, the further processing may be continued by forming drain and source regions and the like.

Figure 3D:
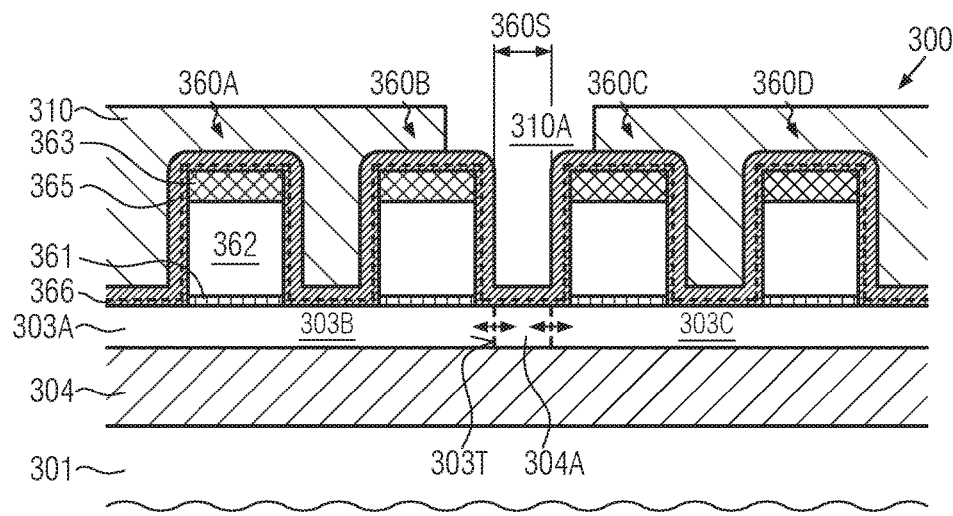
FIGS. 3D-3E schematically illustrate cross-sectional views of the semiconductor device in a sequence for patterning the active semiconductor on the basis of sacrificial sidewall spacers formed temporarily on sidewalls of the gate electrode structures, according to illustrative embodiments.

FIG. 3D schematically illustrates a cross-sectional view of the semiconductor device 300 according to further illustrative embodiments. As shown, the gate electrode structures 360A-360B may be covered with a sacrificial mask layer 365, such as silicon dioxide and the like, wherein a thickness of the layer 365 may be selected so as to appropriately adjust the spacing 360S between the gate electrode structures 360B, 360C. That is, the actual spacing 360S and, thus, the position of the bounding surfaces 303T of the respective semiconductor regions upon forming the isolation trench 304A may be determined, in addition to the basic spacing of the electrode structures 360A-360D, on the basis of a deposition process, which may be controlled in a highly accurate manner, thereby providing the potential of significantly reducing the spacing 360S without contributing to further complexity of the entire patterning process. For instance, if a certain portion of active material at the proximal sides, i.e., proximal with respect to the isolation trench 304A with the gate electrode structures 360B, 360C, may be required, an appropriate layer thickness may be selected in order to reduce the size of the opening 304A and, thus, increase the respective extension of the active regions 303B, 303C.

After the deposition of the sacrificial layer 365 with a desired thickness, the mask 310 may be formed, however, without imparting additional complexity to the respective lithography process, as discussed above. Thereafter an anisotropic etch recipe may be applied in order to etch through exposed portions of the sacrificial layer 365 and through the semiconductor material so as to obtain the isolation trench 304A and, thus, the separated active regions 303B, 303C. Thereafter, the mask 310 may be removed and the sacrificial layer 365 may also be removed by using appropriate removal techniques, such as wet chemical etch recipes for removing the mask 310 and, subsequently, removing the sacrificial layer 365 by any other plasma-assisted or wet chemical etch recipes.

In some illustrative embodiments, a protective thin liner material 366, such as silicon dioxide, silicon nitride and the like, may be formed prior to the deposition of the sacrificial material 365 and may provide a high degree of etch selectivity upon removing the sacrificial layer 365. Consequently, superior integrity of any sensitive gate material may be preserved during the corresponding process sequence. In some illustrative embodiments, the thin liner 366 may also be removed, however, at a significantly reduced process time and, thus, with minimal effect on any sensitive gate material. In other cases, the thin liner 366 may be preserved during the further processing of the semiconductor device 300.

Figure 3E:
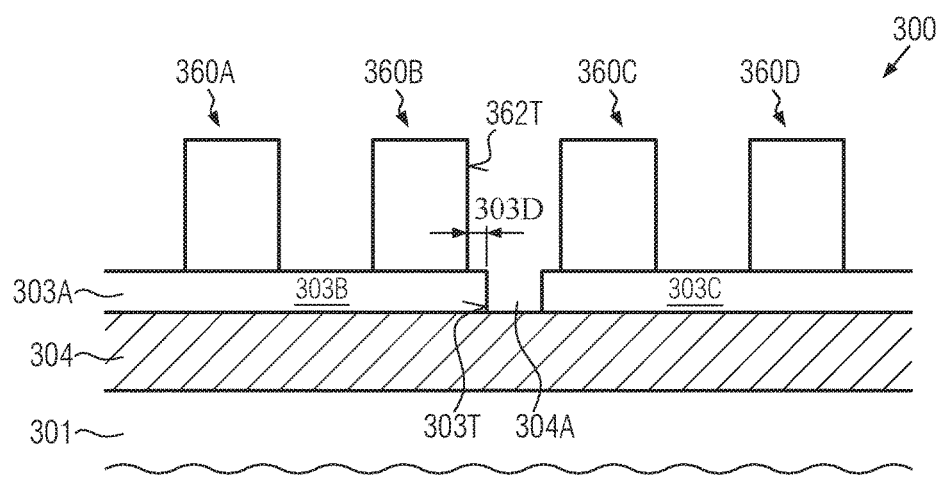

FIG. 3E schematically illustrates the semiconductor device 300 after completing the above-described process sequence. Consequently, the gate electrode structures 360B, 360C may have proximal sidewall faces 362T which may be aligned to the corresponding bounding surfaces 303T of the isolation trench 304A with a specific deviation depending on the thickness of the sacrificial layer 365 (see FIG. 3D). Consequently, a corresponding protruding semiconductor portion 303D may be provided laterally adjacent to the proximal sidewall face 362T. In this manner, a precise control of the lateral distance between the active regions 303B, 303C may be accomplished in a self-aligned regime without requiring additional efforts in the corresponding lithography and patterning processes. Thereafter, the further processing may be continued, as also discussed above.

Figure 4A:
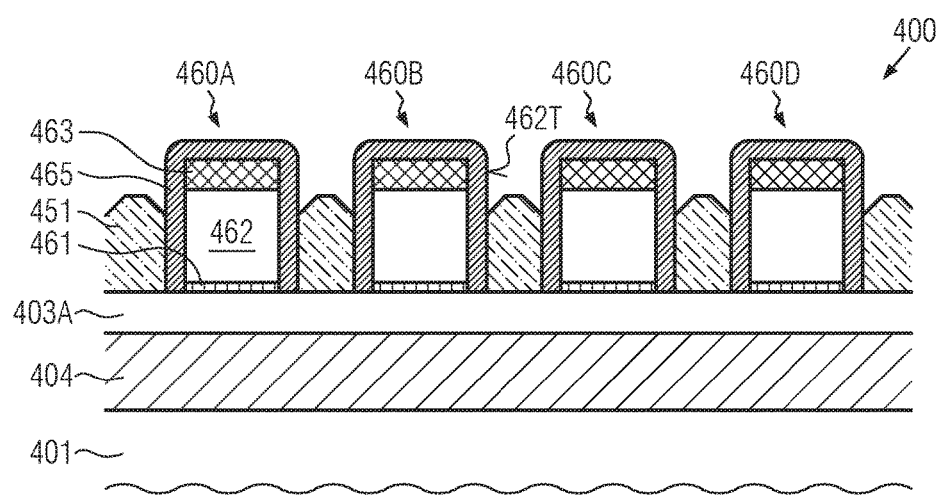
FIGS. 4A-4C schematically illustrate cross-sectional views of a semiconductor device, such as the semiconductor device of FIG. 1, during various manufacturing stages when patterning the longitudinal semiconductor region in a further advanced manufacturing stage, i.e., after forming respective drain and source regions, according to still further illustrative embodiments.
Figure 4B:
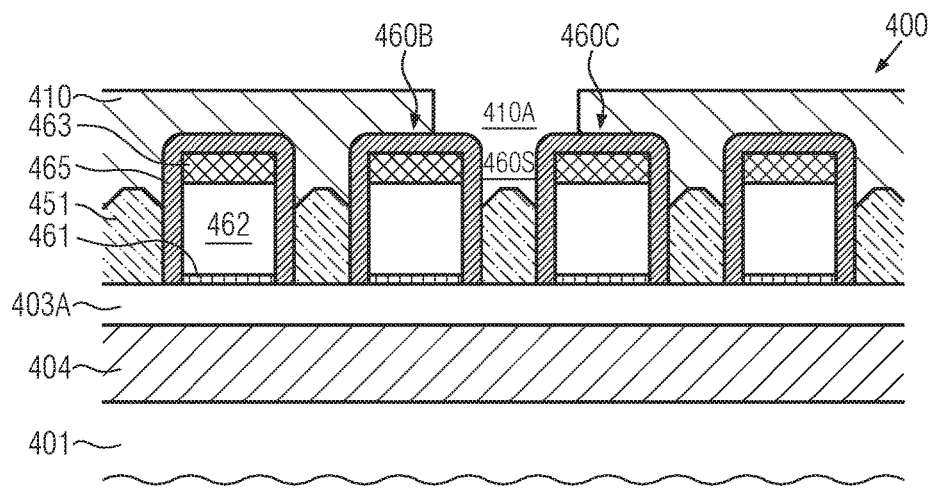
Figure 4C:
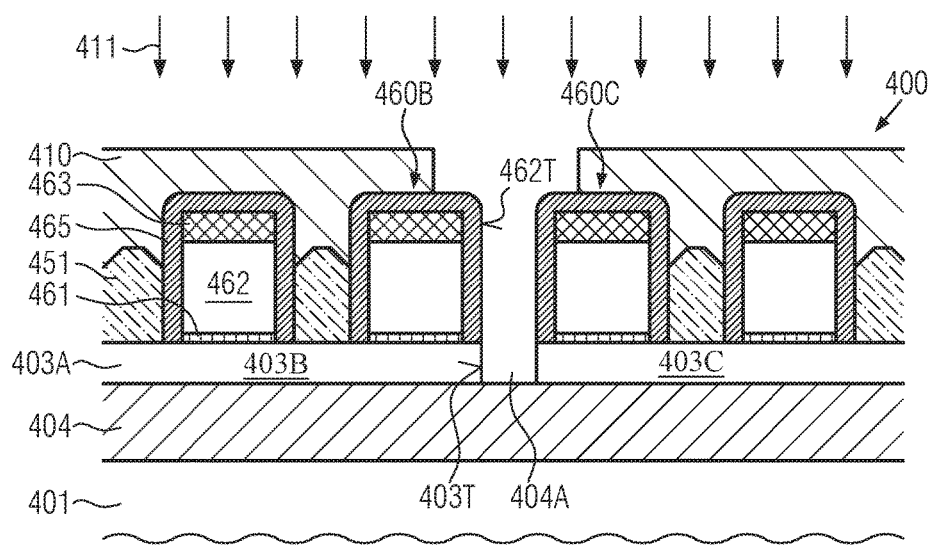

With reference to FIGS. 4A-4C, further techniques will be described in which the cutting through of the semiconductor material may be performed in an even later stage.

FIG. 4A schematically illustrates a cross-sectional view of a semiconductor device 400 in a moderately advanced manufacturing stage. As illustrated, gate electrode structures 460A-460D may be formed on a semiconductor region 403A, which may be bordered along a first lateral direction, as also discussed above, for instance, with respect to the semiconductor device 100 in FIG. 1. Similarly, with respect to other components, such as an optional buried insulating layer 404 and a substrate material 401, the same criteria may apply as also previously explained with reference to the semiconductor devices 100, 200 and 300.

In the manufacturing stage shown, the gate electrode structures 460A-460D may be considered as substantially completed in terms of their configuration along a length direction, i.e., in FIG. 4A, the horizontal direction, thereby defining or providing respective sidewall faces 462T formed by respective sidewall spacers 465. On the other hand, the "vertical" configuration may still be modified, for instance, by removing at least a portion of the cap material 463 and the like. Moreover, in this manufacturing stage, drain and source regions 451 may be formed adjacent to the respective gate electrode structures 460A-460D. In some illustrative embodiments, sophisticated transistor architectures may require the drain and source regions 451 to be provided in the form of a raised configuration in which a highly doped semiconductor material may be epitaxially grown on exposed portions of the semiconductor region 403A. For example, as previously discussed, in sophisticated fully depleted transistor architectures, complex gate electrode structures with a gate length of 30 nm and significantly less, in combination with raised drain and source regions, may be used, while the fully depleted configuration may be established by using a thickness of 15 nm and less for the semiconductor region 403A.

The semiconductor device 400 as illustrated in FIG. 4A may be formed on the basis of any well-established concept, wherein, in particular, respective selective epitaxial growth techniques in combination with an appropriate masking regime may be applied so as to form the drain and source regions 451.

FIG. 4B schematically illustrates the semiconductor device 400 with a mask 410 in order to expose a space 460S between the gate electrode structures 460B, 460C. Regarding the mask 410, the same criteria may apply as previously discussed in the context of the masks 110, 210 and 310. Similarly, position and accuracy for positioning an opening 410A for exposing the space 460S may be accomplished on the basis of constraints as previously discussed due to the self-aligned nature of the corresponding subsequent patterning process. It should be appreciated that even the deposition of one or more appropriate mask materials for the mask 410 may be less demanding due to the presence of the raised drain and source regions 451.

FIG. 4C schematically illustrates a cross-sectional view of the semiconductor device 400 in a further advanced manufacturing stage in which an etch process or sequence of etch processes 411 may be performed on the basis of the mask 410 in order to form an isolation trench 404A, thereby providing separated active regions 403B, 403C. During the process or process sequence 411, an etch chemistry may be applied so as to efficiently remove semiconductor material of the drain and source regions 451, which may be accomplished on the basis of well-established wet chemical or plasma-assisted etch recipes for etching semiconductor material, such as silicon, silicon/germanium and the like, in the presence of a polymer material and a dielectric material, such as silicon nitride and the like.

In some illustrative embodiments, the etch process may be continued so as to etch through the semiconductor material of the semiconductor region 403A, thereby obtaining the isolation trench 404A and, thus, the bounding surfaces 403T, which may be substantially aligned with respect to sidewall surfaces 462T of the gate electrode structures 460B, 460C. In other cases, depending on the specifics of the material composition of the drain and source regions 451, different etch recipes may be selected, for instance, for removing the main portion of the drain and source regions 451 and subsequently etching through the semiconductor material for forming the isolation trench 404A. For example, wet chemical etch recipes may be applied so as to remove the main portion of the raised drain and source regions 451, while an anisotropic recipe may be applied so as to obtain the bounding surfaces 403T with minimum undercut of the gate electrode structures 460B, 460C. In other cases, as previously discussed, a certain amount of underetching may be acceptable, in particular, when the thickness of the active semiconductor regions 403B, 403C may be 15 nm and significantly less.

After the process or process sequence 411, the mask 410 may be removed, for instance, on the basis of any appropriate etch recipe, while, on the other hand, any sensitive gate materials are reliably encapsulated.

Thereafter, the further processing may be continued, for instance, by removing the cap material 463, if required, and forming highly conductive metal semiconductor compounds in exposed semiconductor areas for reducing overall contact resistance.

As a result, the present disclosure provides techniques and corresponding semiconductor devices in which the "cutting" of active semiconductor regions previously patterned along a first lateral direction may be accomplished in a late manufacturing stage on the basis of a self-aligned patterning regime, which may, thus, result in superior process conditions and relaxed constraints of a corresponding lithography and patterning sequence. Furthermore, since respective gate electrodes may be at least partially provided on the active regions, the tendency of retraction of end portions may be significantly reduced, since corresponding end portions may be reliably mechanically stabilized by respective gate electrode structures. Consequently, strain relaxation, which may be conventionally observed, may be avoided or at least significantly reduced due to the stabilizing effect of the gate electrode structures, which may also act as efficient etch masks.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    bordering a semiconductor region of a semiconductor device along a length direction, wherein bordering said semiconductor region comprises forming an isolation structure in a semiconductor substrate and laterally adjacent to a lateral bounding surface of said semiconductor region;
    forming at least a portion of each of a plurality of gate electrode structures above said semiconductor region, said at least said portion of each of said plurality of gate electrode structures having a length dimension extending along said length direction and a width dimension extending along a width direction, the width direction being transverse to the length direction; and
    after forming said plurality of gate electrode structures, bordering said semiconductor region along said width direction.

2. The method of claim 1, wherein bordering said semiconductor region along said width direction comprises removing material of said semiconductor region in a space between a first one of said plurality of gate electrode structures and an adjacent second one of said plurality of gate electrode structures.

3. The method of claim 2, further comprising filling further spaces between gate electrode structures other than said first and second gate electrode structures with a sacrificial mask material prior to removing said material of said semiconductor region.

4. The method of claim 3, wherein said sacrificial mask material comprises a resist material.

5. The method of claim 2, wherein removing a material of said semiconductor region in a space between a first one of said plurality of gate electrode structures and an adjacent second one of said plurality of gate electrode structures comprises etching said material and using a buried insulating layer formed below said semiconductor region as an etch stop material.

6. The method of claim 1, wherein forming at least a portion of each of a plurality of gate electrode structures comprises forming a sidewall spacer on sidewalls of said at least a portion prior to bordering said semiconductor region along said width direction.

7. The method of claim 6, further comprising preserving said sidewall spacer as a part of said plurality of gate electrode structures.

8. The method of claim 6, further comprising removing said sidewall spacer prior to continuing further processing of said semiconductor device.

9. The method of claim 1, further comprising forming drain and source regions adjacent to said plurality of gate electrode structures prior to bordering said semiconductor region along said width direction.

10. The method of claim 1, wherein said isolation structure is formed to laterally bound said semiconductor region, said isolation structure having a sidewall surface that interfaces with said lateral bounding surface of said semiconductor region.

11. A method of forming a semiconductor device, said method comprising:
    forming two adjacent electrode structures above a semiconductor layer, said two adjacent electrode structures forming a space therebetween, wherein each of said two adjacent electrode structures extends over said semiconductor layer and over an isolation structure that laterally bounds said semiconductor layer; and removing said semiconductor layer in said space by using said two adjacent electrode structures as an etch mask.

12. The method of claim 11, wherein said semiconductor layer is removed in said space prior to encapsulating an electrode material of said two adjacent electrode structures.

13. The method of claim 11, wherein forming said two adjacent electrode structures comprises forming a sidewall spacer adjacent to sidewalls of an electrode material prior to removing said semiconductor layer in said space.

14. The method of claim 11, further comprising forming at least one of a drain region and a source region in said space prior to removing said semiconductor layer in said space.

15. The method of claim 11, further comprising forming a mask so as to expose at least said space prior to removing said semiconductor layer in said space.

16. The method of claim 15, wherein forming said mask comprises forming a resist mask.

17. The method of claim 11, wherein removing said semiconductor layer in said space comprises etching material of said semiconductor layer and using a buried insulating layer as an etch stop material.

18. The method of claim 11, wherein said isolation structure is formed having a sidewall surface that interfaces with a lateral bounding surface of said semiconductor layer.

19. A method of forming a semiconductor device, said method comprising:

forming an isolation structure in a semiconductor layer of an SOI substrate, said isolation structure having a sidewall surface that laterally interfaces with a lateral bounding surface of a semiconductor region of said semiconductor layer;

forming first and second gate electrode structures above said SOI substrate, said first and second gate electrode structures each extending over an upper surface of said semiconductor region and over an upper surface of said isolation structure;

performing at least one etching process using at least a portion of each of said first and second gate electrode structures to remove a portion of said semiconductor region below a space defined between said first and second gate electrode structures and form an isolation trench that exposes an insulating layer of said SOI substrate below said semiconductor layer; and forming an insulating material in said isolation trench.

20. The method of claim 19, further comprising forming a mask layer above said first and second gate electrode structures prior to performing said at least one etching process, said mask layer comprising a mask opening that exposes said at least said portion of each of said first and second gate electrode structures.

* * * * *